United States Patent
Ye et al.

(10) Patent No.: US 11,824,044 B2
(45) Date of Patent: Nov. 21, 2023

(54) STACKED SEMICONDUCTOR DIE ASSEMBLIES WITH DIE SUPPORT MEMBERS AND ASSOCIATED SYSTEMS AND METHODS

(71) Applicant: Micron Technology, Inc., Boise, ID (US)

(72) Inventors: Seng Kim Ye, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 36 days.

(21) Appl. No.: 17/409,427

(22) Filed: Aug. 23, 2021

(65) Prior Publication Data

US 2021/0384167 A1     Dec. 9, 2021

Related U.S. Application Data

(60) Division of application No. 16/876,520, filed on May 18, 2020, now Pat. No. 11,101,244, which is a
(Continued)

(51) Int. Cl.
*H01L 25/00* (2006.01)
*H01L 25/065* (2023.01)
(Continued)

(52) U.S. Cl.
CPC .......... *H01L 25/0657* (2013.01); *H01L 21/78* (2013.01); *H01L 24/32* (2013.01); *H01L 24/33* (2013.01); *H01L 24/49* (2013.01); *H01L 24/73* (2013.01); *H01L 24/83* (2013.01); *H01L 24/85* (2013.01); *H01L 25/18* (2013.01); *H01L 25/50* (2013.01); *H01L 23/3128* (2013.01); *H01L 24/29* (2013.01); *H01L 24/48* (2013.01); *H01L 2224/05554* (2013.01); *H01L 2224/05599* (2013.01); *H01L 2224/2919* (2013.01); *H01L 2224/32145* (2013.01); *H01L 2224/32225* (2013.01); *H01L 2224/45015* (2013.01); *H01L 2224/48225* (2013.01); *H01L 2224/48227* (2013.01); *H01L 2224/49171* (2013.01); *H01L 2224/73265* (2013.01); *H01L 2224/8314* (2013.01); *H01L 2224/8385* (2013.01); *H01L 2224/83191* (2013.01);
(Continued)

(58) Field of Classification Search
CPC ..... H01L 25/0657; H01L 24/32; H01L 24/33; H01L 24/49; H01L 24/73; H01L 24/83
USPC .......................................................... 257/777
See application file for complete search history.

(56) References Cited

U.S. PATENT DOCUMENTS

6,858,938 B2 *  2/2005  Michii ............... H01L 25/0657
                                                        257/777
7,459,776 B1    12/2008  St et al.
(Continued)

*Primary Examiner* — Dzung Tran
(74) *Attorney, Agent, or Firm* — Perkins Coie LLP (57) ABSTRACT

Stacked semiconductor die assemblies with die support members and associated systems and methods are disclosed herein. In one embodiment, a semiconductor die assembly can include a package substrate, a first semiconductor die attached to the package substrate, and a support member attached to the package substrate. The support member can be separated from the first semiconductor die, and a second semiconductor die can have one region coupled to the support member and another region coupled to the first semiconductor die.

20 Claims, 11 Drawing Sheets

Related U.S. Application Data continuation of application No. 15/960,960, filed on Apr. 24, 2018, now Pat. No. 10,658,336, which is a division of application No. 15/224,066, filed on Jul. 29, 2016, now Pat. No. 9,985,000, which is a division of application No. 14/264,699, filed on Apr. 29, 2014, now Pat. No. 9,406,660.

(51) Int. Cl.
*H01L 25/18* (2023.01)
*H01L 23/00* (2006.01)
*H01L 21/78* (2006.01)
*H01L 23/31* (2006.01)

(52) U.S. Cl.
CPC ............ *H01L 2224/8592* (2013.01); *H01L 2224/85399* (2013.01); *H01L 2224/92247* (2013.01); *H01L 2225/0651* (2013.01); *H01L 2225/06555* (2013.01); *H01L 2225/06562* (2013.01); *H01L 2225/06582* (2013.01); *H01L 2225/06593* (2013.01); *H01L 2924/00014* (2013.01); *H01L 2924/1205* (2013.01); *H01L 2924/143* (2013.01); *H01L 2924/1434* (2013.01); *H01L 2924/15174* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/207* (2013.01)

(56) References Cited

U.S. PATENT DOCUMENTS

| | | |
|---|---|---|
| 9,406,660 B2 | 8/2016 | Ye et al. |
| 9,985,000 B2 | 5/2018 | Ye et al. |
| 10,658,336 B2 | 5/2020 | Ye et al. |
| 2002/0096785 A1 | 7/2002 | Kimura |
| 2002/0121686 A1 | 9/2002 | Uchida et al. |
| 2003/0038374 A1 | 2/2003 | Shim et al. |
| 2004/0164390 A1 | 8/2004 | Wang et al. |
| 2006/0012018 A1 | 1/2006 | Karnezos et al. |
| 2007/0278640 A1 | 12/2007 | Weng et al. |
| 2008/0211089 A1 | 9/2008 | Khan et al. |
| 2009/0014860 A1 | 1/2009 | Liu et al. |
| 2010/0002723 A1 | 2/2010 | Low et al. |
| 2010/0027233 A1 | 2/2010 | Low et al. |
| 2010/0314740 A1 | 12/2010 | Choi et al. |
| 2011/0175222 A1 | 7/2011 | Kim et al. |
| 2012/0086111 A1 | 4/2012 | Iwamoto et al. |
| 2013/0049228 A1 | 2/2013 | Nam et al. |
| 2013/0270717 A1* | 10/2013 | Ko ............... H01L 25/065 257/777 |
| 2015/0311186 A1 | 10/2015 | Ye et al. |
| 2016/0336300 A1 | 11/2016 | Ye et al. |
| 2018/0240785 A1 | 8/2018 | Ye et al. |
| 2020/0279832 A1 | 9/2020 | Ye et al. |

\* cited by examiner

STACKED SEMICONDUCTOR DIE ASSEMBLIES WITH DIE SUPPORT MEMBERS AND ASSOCIATED SYSTEMS AND METHODS

CROSS-REFERENCE TO RELATED APPLICATION(S)

This application is a divisional of U.S. patent application Ser. No. 16/876,520, filed May 18, 2020, now U.S. Pat. No. 11,101,244, which is a continuation of U.S. patent application Ser. No. 15/960,960, filed Apr. 24, 2018, now U.S. Pat. No. 10,658,336, which is a divisional of U.S. patent application Ser. No. 15/224,066, filed Jul. 29, 2016, now U.S. Pat. No. 9,985,000, which is a divisional of U.S. patent application Ser. No. 14/264,699, filed Apr. 29, 2014, now U.S. Pat. No. 9,406,660, each of which is incorporated herein by reference in its entirety.

TECHNICAL FIELD

The disclosed embodiments relate to semiconductor die assemblies and to support members in such assemblies. In several embodiments, the present technology relates to die assemblies that can include a controller die and memory dies carried above the controller die.

BACKGROUND

Packaged semiconductor dies, including memory chips, microprocessor chips, and imager chips, can include semiconductor dies mounted on a package substrate. The semiconductor dies are encased in a plastic protective covering, and each die includes functional features, such as memory cells, processor circuits, and imager devices. Bond pads on the dies are electrically connected between the functional features and terminals on the package substrate that allow the dies to be connected to external circuitry.

To increase the density of dies within a package, the dies can be stacked upon one another within the casing. One challenge with vertically stacked dies, however, is that the dies can have different sizes or footprints. For example, in a memory package, a memory controller die can have a smaller footprint than the memory dies within the package. The memory controller die can be more difficult to wirebond because it is offset from the memory dies. Also, the memory dies can sometimes tilt when stacked upon the smaller memory controller die.

DETAILED DESCRIPTION

Specific details of several embodiments of stacked semiconductor die assemblies having die support members and associated systems and methods are described below. The term "semiconductor die" generally refers to a die having integrated circuits or components, data storage elements, processing components, and/or other features manufactured on semiconductor substrates. For example, semiconductor dies can include integrated circuit memory and/or logic circuitry. A person skilled in the relevant art will also understand that the technology may have additional embodiments, and that the technology may be practiced without several of the details of the embodiments described below with reference to FIGS. 1-8.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as being flipped on their side or inverted.

Figure 1A:
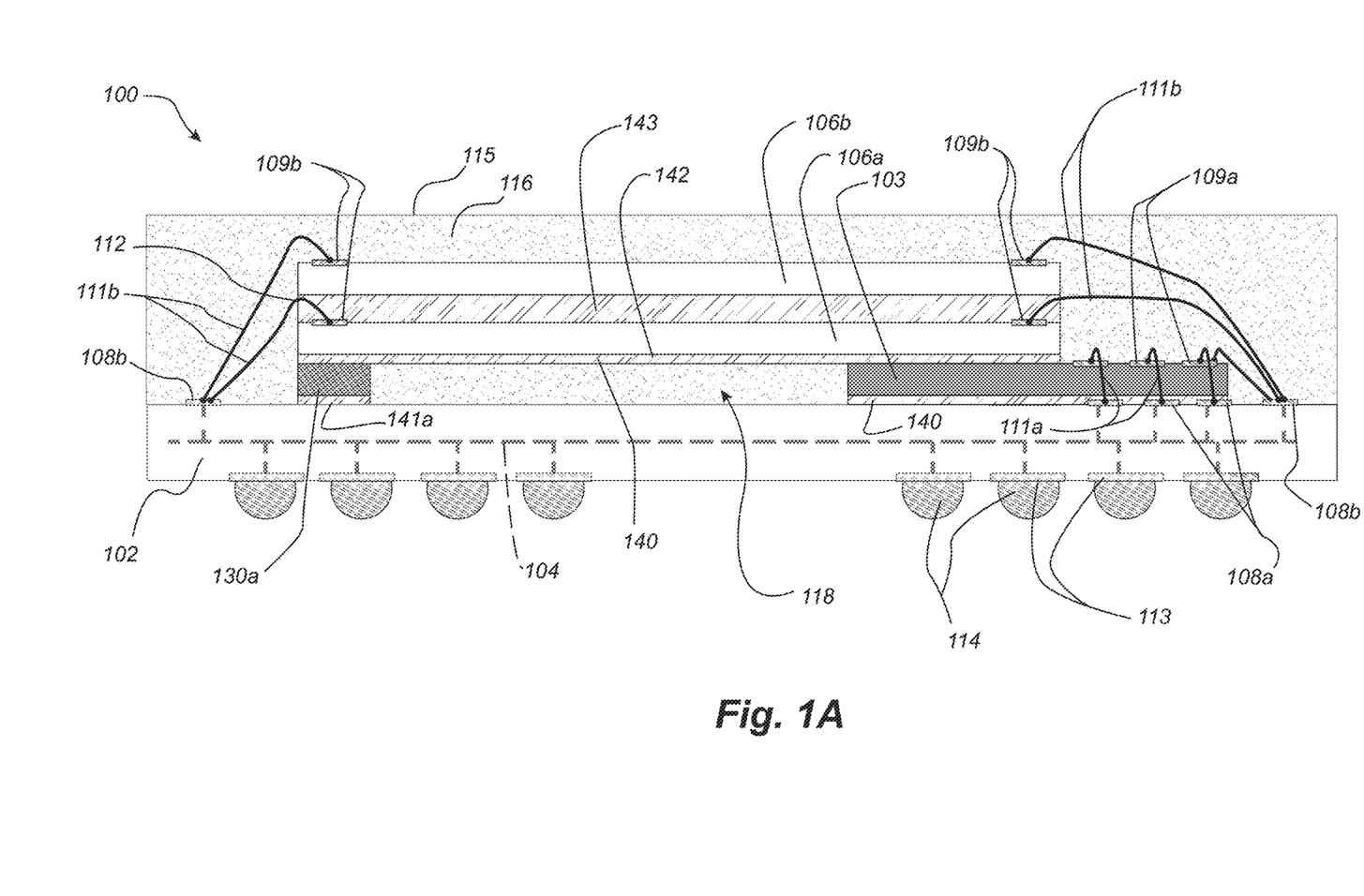
FIG. 1A is a cross-sectional view of a semiconductor die assembly configured in accordance with an embodiment of the present technology.

FIG. 1A is a cross-sectional view of a semiconductor die assembly 100 ("assembly 100") configured in accordance with an embodiment of the present technology. As shown, the assembly 100 includes a package substrate 102 carrying a first semiconductor die, or controller die 103, and support members 130 (only a first support member 130a is visible in FIG. 1A). The controller die 103 and the support members 130 carry first and second semiconductor dies, or first and second memory dies 106a and 106b (collectively "memory dies 106"), arranged in a stack. The package substrate 102 includes a plurality of first bond pads 108a and a plurality of second bond pads 108b. The first bond pads 108a are coupled to corresponding bond pads 109a on the controller die 103 by first wire bonds 111a, and the second bond pads 108b are coupled to corresponding bond pads 109b on each of the memory dies 106 by second wire bonds 111b. The package substrate 102 can include, for example, a printed circuit board or other suitable substrate having electrical connectors 104 (shown schematically), such as metal traces, vias, or other suitable connectors. The electrical connectors 104 can couple the first bond pads 108a and/or the second bond pads 108b to external circuitry (not shown) via package contacts 113 and interconnects 114 (e.g., bump bonds) at the opposite side of the package substrate 102. In several embodiments, the electrical connectors 104 can also couple individual first bond pads 108a with individual second bond pads 108b to electrically intercouple the controller die 103 with the memory dies 106.

The assembly 100 further includes a package casing 115 composed of an encapsulant 116 that at least partially encapsulates the controller die 103, the memory dies 106, and the support members 130. In the illustrated embodiment, the encapsulant 116 also extends into a cavity 118 between the package substrate 102 and the first memory die 106a to at least partially fill the region of the cavity 118 beneath the first memory die 106a that is not occupied by the controller die 103 and the support members 130. In some embodiments, the portion of the encapsulant 116 in the cavity 118 can reinforce the support members 130 and provide further mechanical support beneath the first memory die 106a. The encapsulant 116 can include, for example, a thermoset material, an epoxy resin, or other suitable compound that provides mechanical support, shielding from the ambient (e.g., from humidity), and/or electrical isolation (e.g., between wire bonds).

The controller die 103 and the memory dies 106 can each be formed from a semiconductor substrate, such as silicon, silicon-on-insulator, compound semiconductor (e.g., Gallium Nitride), or other suitable substrate. The semiconductor substrate can be cut or singulated into semiconductor dies having any of variety of integrate circuit components or functional features, such as dynamic random-access memory (DRAM), static random-access memory (SRAM), flash memory, other forms of integrated circuit devices, including memory, processing circuits, imaging components, and/or other semiconductor devices. In selected embodiments, the assembly 100 can be configured as a memory in which the memory dies 106 provide data storage (e.g., NAND dies) and the controller die 103 provides memory control (e.g., NAND control). In some embodiments, the assembly 100 can include other semiconductor dies in addition to and/or in lieu of one or more of the controller die 103 and/or the memory dies 106. For example, instead of two memory dies, the assembly 100 can include more than two memory dies (e.g., four dies, eight dies, etc.) or only a single memory die. Further, in various embodiments, the dies of the assembly 100 can have different sizes. For example, in some embodiments one or both of the memory dies 106 can extend beyond the support members 130 and/or the controller die 103 at one or more sides.

As further shown in FIG. 1A, the controller die 103 is attached to the package substrate 102 by a die-attach material 140 (e.g., a die-attach film). The first support member 130a is attached to the package substrate 102 by a die-attach material 141a, and the second support member 130b (shown in FIG. 1B) is attached to the package substrate 102 by a die-attach material 141b (shown in FIG. 3A). The memory dies 106, in turn, are attached to the support members 130 by a die-attach material 142 and to one another by a "film-over-wire" material 143 ("over-wire material 143"). In several embodiments, the die-attach materials 140, 141a-b, and 142 can be formed from the same or similar materials. In some embodiments, the over-wire material 143 can be formed from the same or similar materials as the die-attach materials 140, 141a-b, and 142, but the over-wire material 143 can have a greater thickness to accommodate a wire portion 112 of the first wire bonds 111a between the memory dies 106. In selected embodiments, the die-attach materials 140, 141a-b, and 142 and the over-wire material 143 can each include a laminate film of epoxy-based material. Such laminate films can include, for example, a die-attach or a dicing-die-attach film (known to those skilled in the art as "DAFs" or "DDFs," respectively). In one embodiment the die-attach materials and/or film-over wire materials can each include DAFs or DDFs provided by Henkel AG & Co. of Shangai, China (e.g., Model Nos. Ablestick ATB-100, 100U, 100A, 100U).

In some conventional package assemblies, the controller die can be positioned between the package substrate and a stack of memory dies. This configuration is typically formed by encapsulating the controller die with an encapsulant and then the memory dies are stacked upon the surface of the encapsulant. One challenge with encapsulating the controller die at this stage, however, is that it complicates manufacturing. For example, the mounting surface on the encapsulant can be uneven. When the memory dies are stacked on an uneven mounting surface, they can cant or tilt to the extent that the dies project outside of the protective casing. Also, die tilt can make wirebonding more difficult because the wire bonds have different lengths at the opposite sides of the assembly. Another conventional manufacturing technique involves forming a cavity in the package substrate into which the controller die can be inserted. This technique can also complicate manufacturing and increase costs because it requires the package substrate to be milled or etched to form the cavity.

Embodiments of die assemblies configured in accordance with several embodiments of the present technology can address these and other limitations of conventional die assemblies. For example, one advantage is that the stack of memory dies 106 can be mounted to the support members 130 without having to first encapsulate the controller die 103 beneath the memory dies 106. A related advantage is that the high temperature molding and curing steps for encapsulating the controller die can be eliminated and thus reduce thermal cycling. Accordingly, manufacturing can be less complicated because it can eliminate several manufacturing steps. Another advantage is that the support members 130 can have a coefficient of thermal expansion (CTE) that is similar to or the same as the controller die 103 and/or the memory dies 106. For example, the support members 130 can be formed from semiconductor materials, such as silicon. Such CTE matching reduces thermal stresses within the package during operation. Yet another advantage is that the memory dies 106 are not prone to tilt because the support members 130 can have the same height and the die-attach materials 140, 141a-b, and 142 can be formed from a laminate film with a uniform thickness.

Figure 1B:
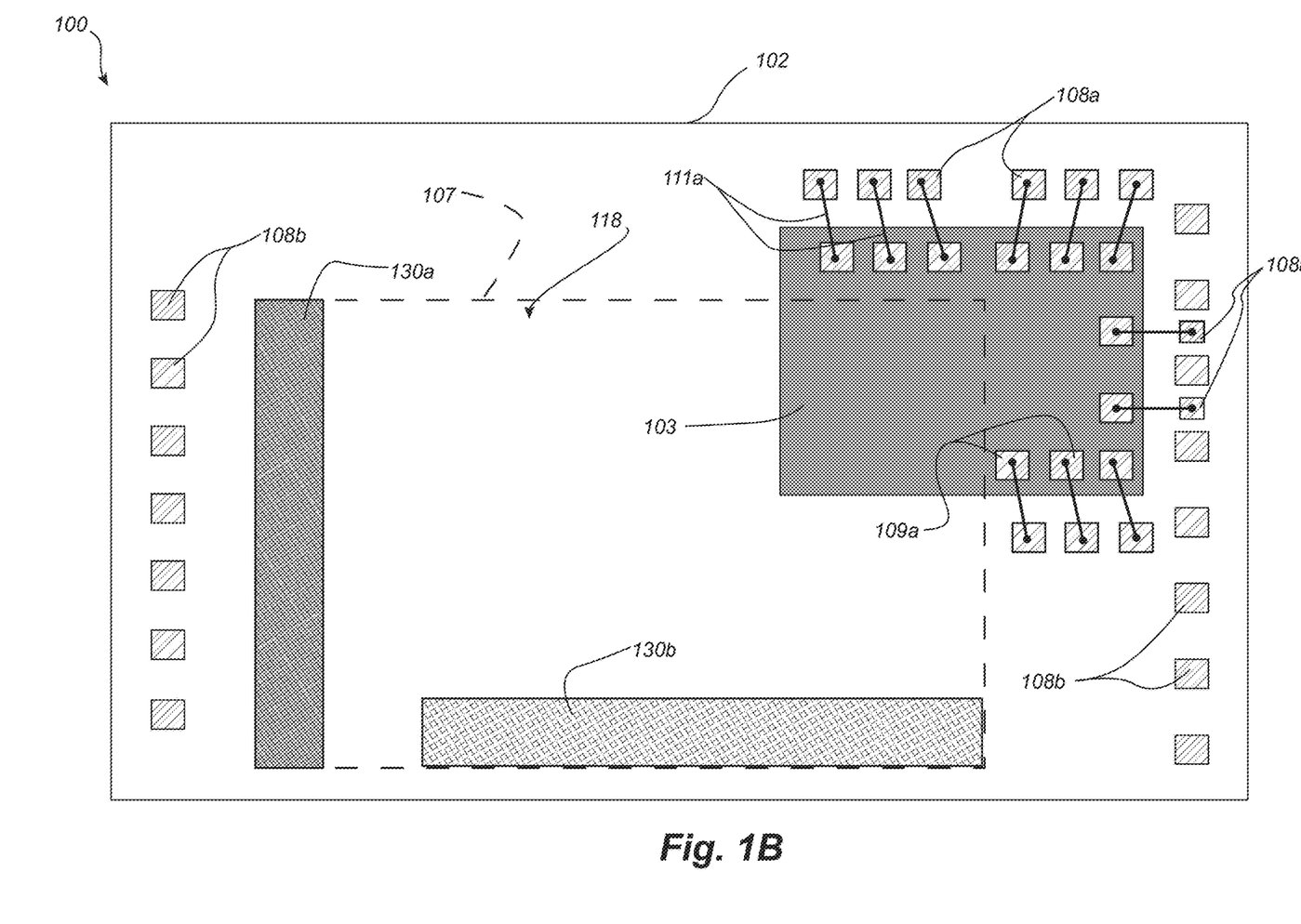
FIG. 1B is a top plan view of the assembly of FIG. 1A with a casing and a semiconductor die stack removed from the assembly.

FIG. 1B is a top plan view of the assembly 100 with the casing 115 and the memory dies 106 shown in FIG. 1A removed for purposes of illustration. As shown, the controller die 103 is located partially within a perimeter, or footprint 107 (shown in hidden lines) of the stack of memory dies 106 (FIG. 1A) superimposed on the package substrate 102. The first support member 130a is positioned with a second support member 130b within the footprint 107 and is generally perpendicular to the second support member 130b. In several embodiments, the support members 130 can each include an elongate member formed from an interposer substrate, a printed circuit board, a semiconductor wafer or die, or anther suitable support material. In one embodiment described in greater detail below, the support members 130 can be pieces of semiconductor material that are cleaved (e.g., diced or singulated) from a semiconductor wafer or die, such as a "blank" silicon wafer or die.

Figure 2:
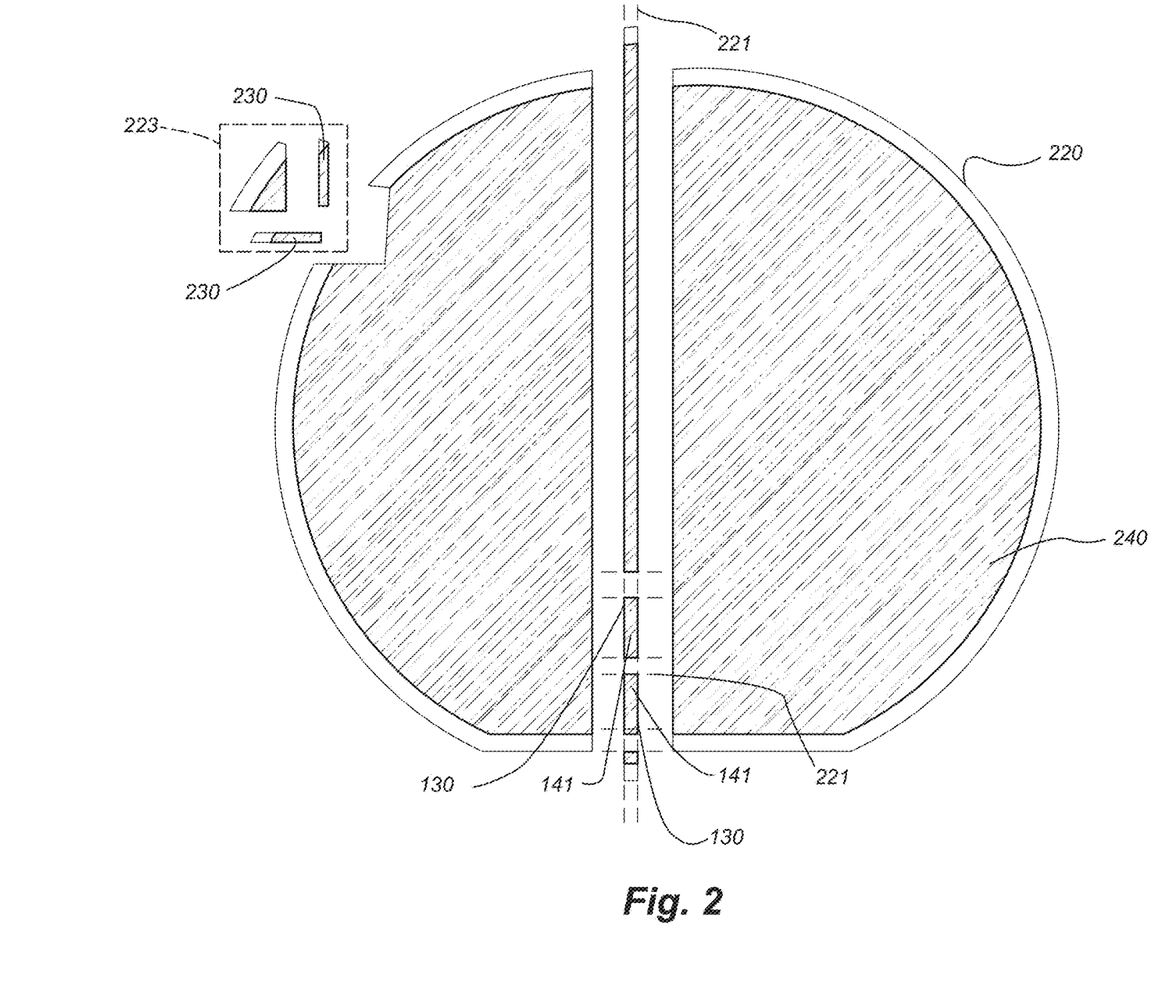
FIG. 2 is a top plan view of a semiconductor wafer that has been cleaved to form support members of the semiconductor die assembly in accordance with an embodiment of the present technology.

FIG. 2 is a top plan view of a semiconductor wafer 220 that has been cleaved to form the support members 130 with die attach material 141 in accordance with an embodiment of the present technology. In the illustrated embodiment, the support members 130 are formed by first covering the semiconductor wafer 220 with a die-attach material 240 (e.g., a die-attach film) and then simultaneously cutting the wafer 220 and the die-attach material 240 along multiple dicing lines 221. Once cut, the support members 130 can then be attached to the package substrate 102 (FIG. 1A) via the die-attach materials 141 formed from the respective portions of die-attach material 240. In one embodiment, the support members 130 can be formed from a blank silicon wafer. In another embodiment, support members can be formed from portions of a semiconductor wafer that might otherwise be discarded. For example, support members 230 can be formed from an edge portion 223 of the semiconductor wafer 220 left over after die singulation. In additional or alternate embodiments, non-yielding or non-functioning dies can also be cut into multiple pieces to form individual spacer members.

Figure 3A:
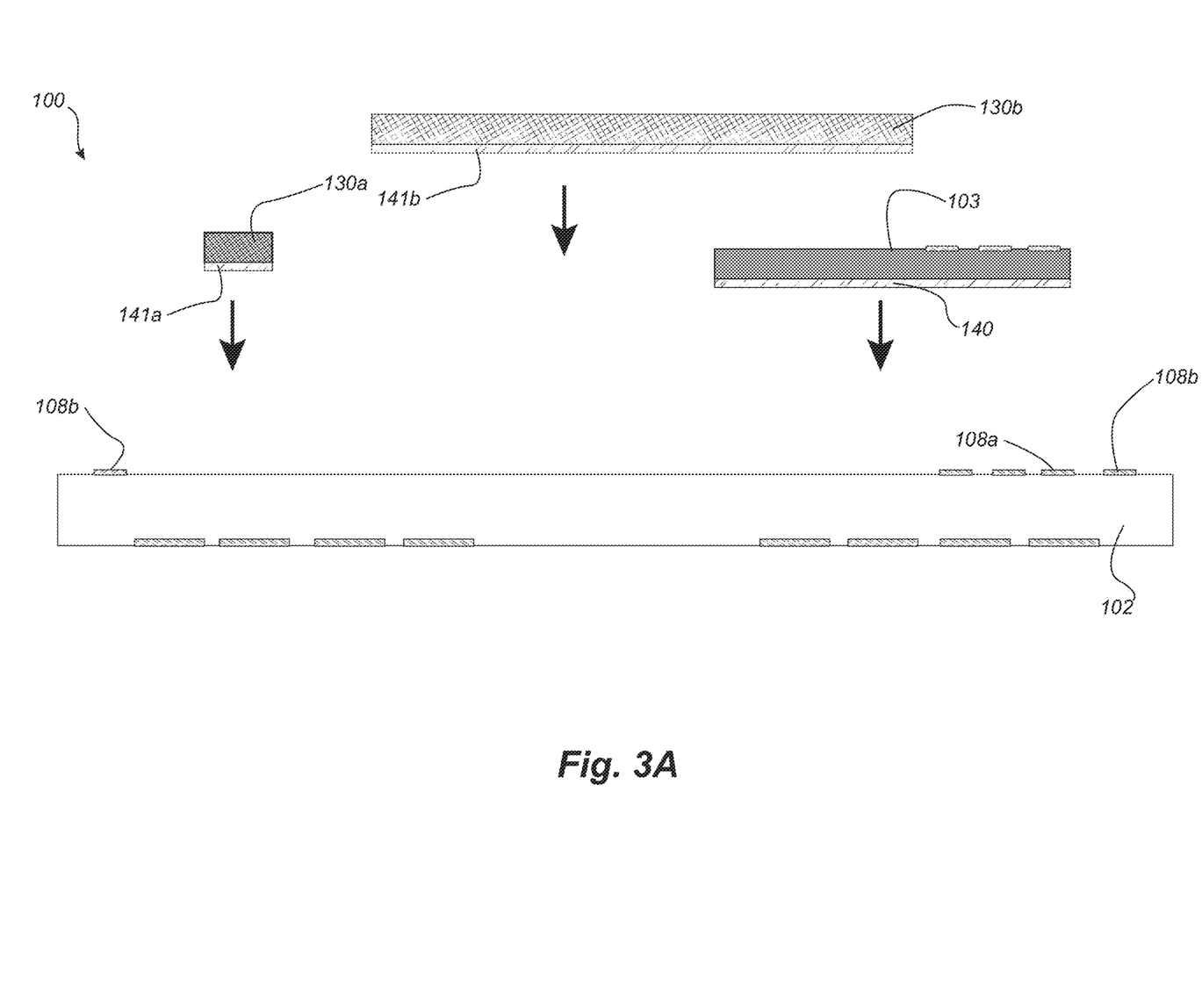
FIGS. 3A-3C are cross-sectional views illustrating the semiconductor die assembly of FIG. 1A at various stages of manufacture in accordance with an embodiment of the present technology.
Figure 3B:
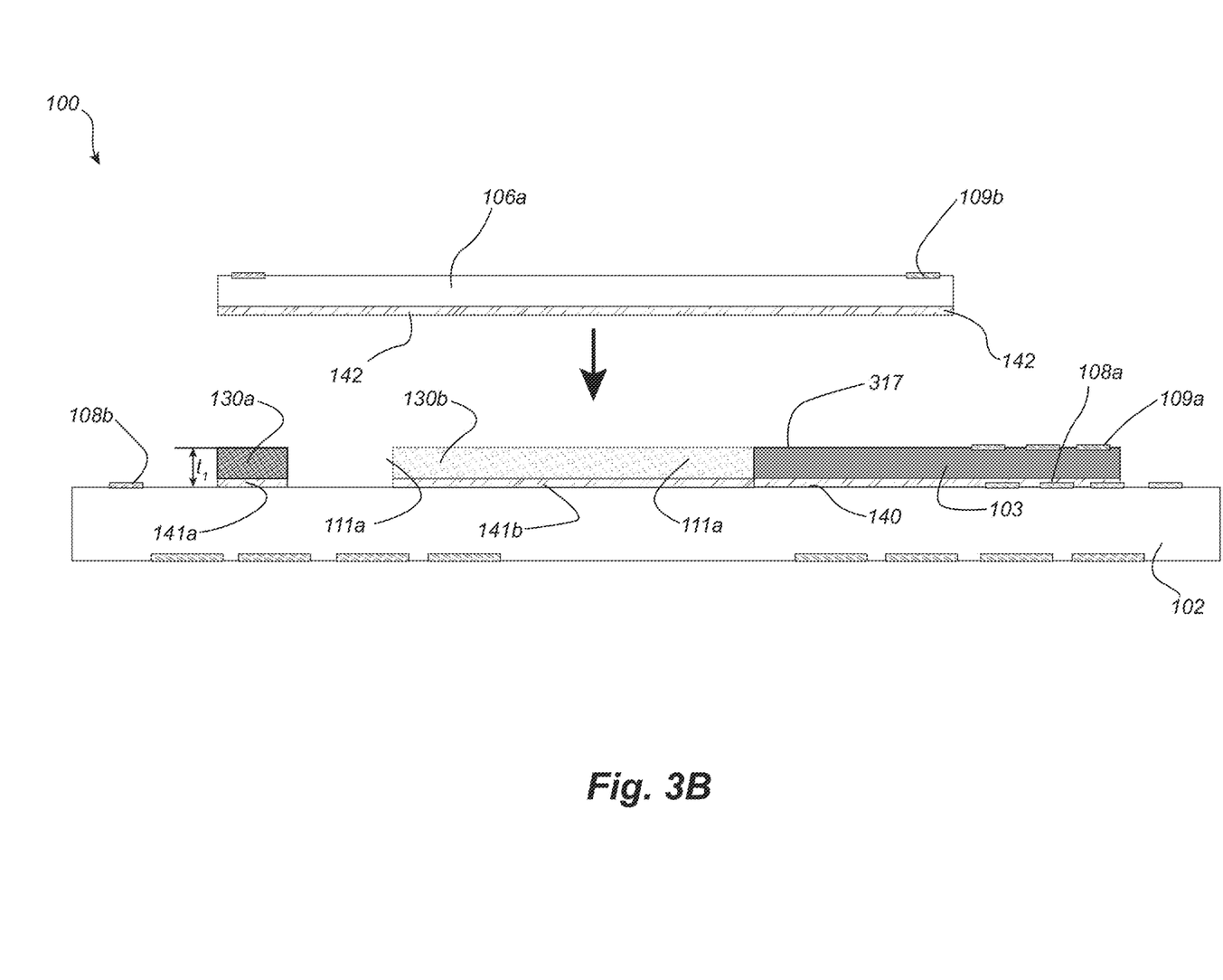
Figure 3C:
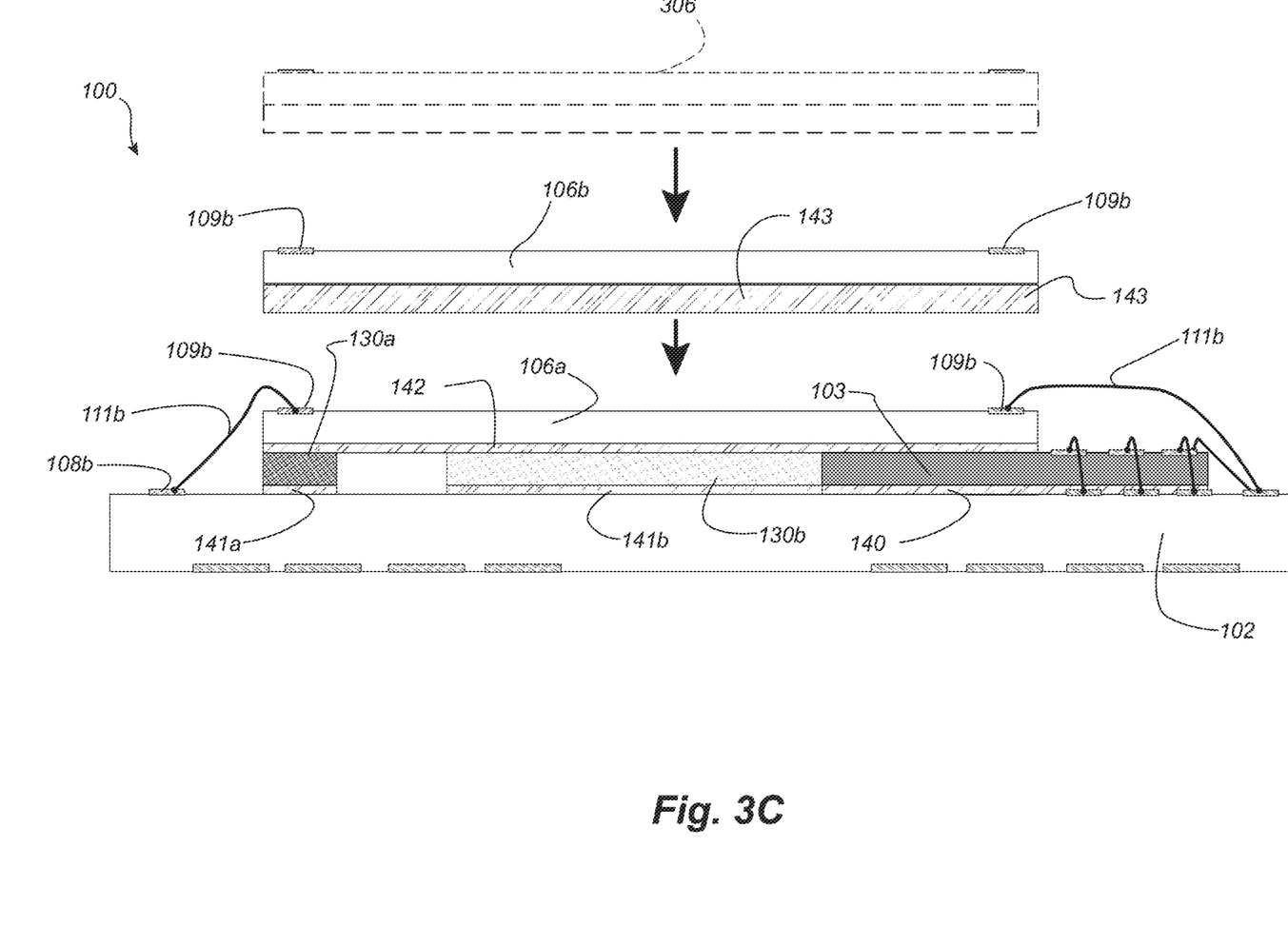

FIGS. 3A-3C are cross-sectional views illustrating the assembly 100 at various stages of manufacture in accordance with an embodiment of the present technology. Referring first to FIG. 3A, the controller die 103 is attached to the package substrate 102 with the die-attach material 140, and the first and second support members 130a and 130b are attached to the package substrate with die-attach materials 141a-b, respectively. In one embodiment, one or more of the die-attach materials 140 and 141a-b can include a pressure-set film that adheres materials together when it is compressed (e.g., between the package substrate 102 and each of the support members 130) beyond a threshold level of pressure. In another embodiment, one or more of the die-attach materials 140 and 141a-b can be a UV-set film that is set by exposure to UV radiation.

FIG. 3B shows the assembly 100 after forming the first wirebonds 111a between the first bond pads 108a of the package substrate 102 and the corresponding bond pads 109a of the controller die 103. Once the first wirebonds 111a are formed, the first memory die 106a can be mounted to the support members 130 and a mounting surface 317 of the controller die 103 via the die-attach material 141a.

FIG. 3C shows the assembly 100 after forming the second wirebonds 111b between the second bond pads 108b of the package substrate 102 and the corresponding bond pads 109b of the first memory die 106a. After the second wirebonds 111b are formed, the second memory die 106b can be attached to the first memory die 106a with the over-wire material 143. Once the memory dies 106 are attached to one another, processing can continue with subsequent manufacturing stages. For example, processing can continue by wire bonding the second memory die 106b to the package substrate 102 and then molding the package casing 115 (FIG. 1A) over the die stack. In some embodiments, one or more additional memory dies 306 (shown in hidden lines) can be stacked above the second memory die 106b and wirebonded to the second bond pads 108b of the package substrate 102.

Figure 4:
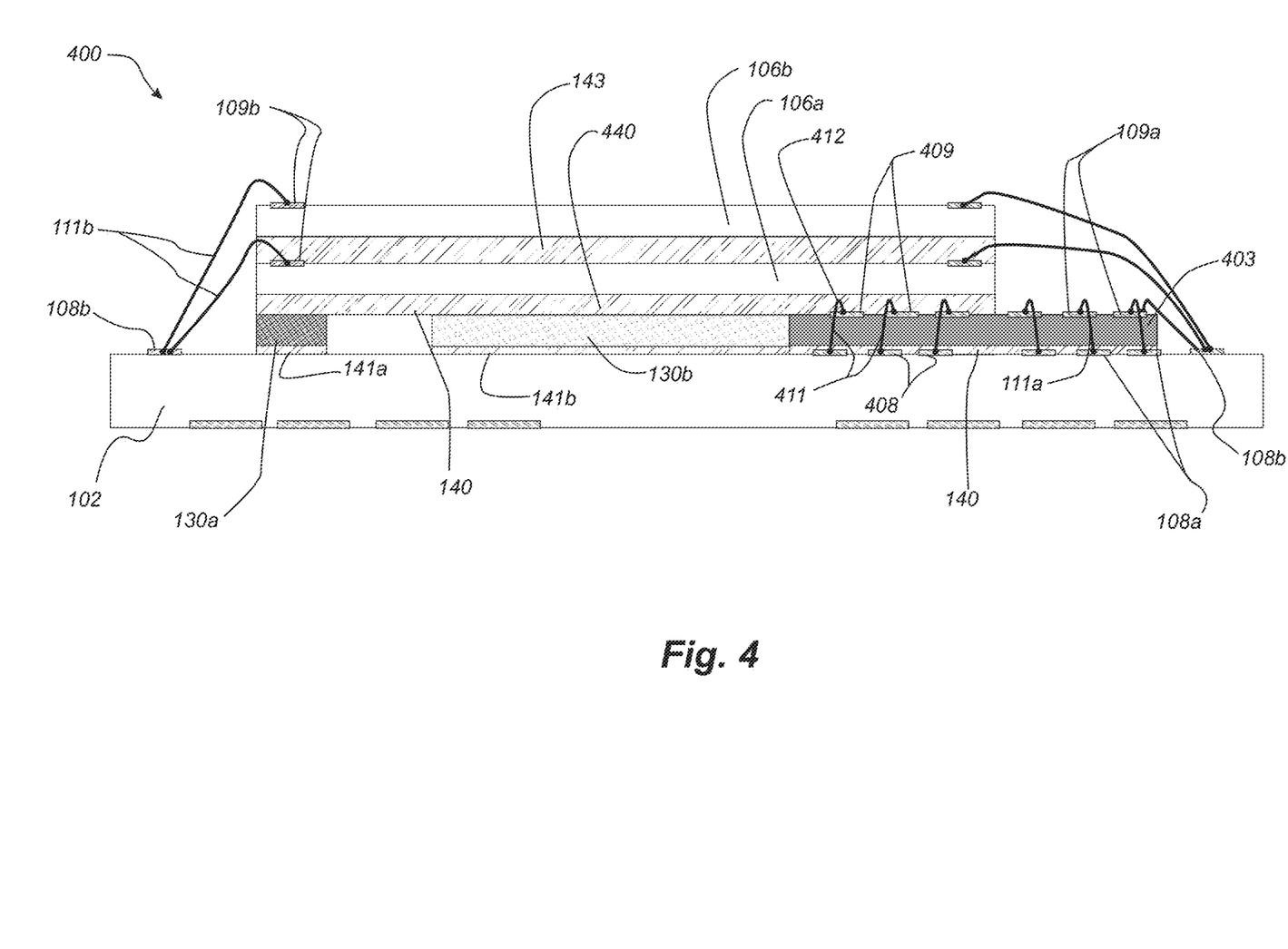
FIG. 4 is a cross-sectional view of a semiconductor die assembly configured in accordance with another embodiment of the present technology.

FIG. 4 is a cross-sectional view of a semiconductor die assembly 400 ("assembly 400") configured in accordance with another embodiment of the present technology. The assembly 400 can include features generally similar to those of the assembly 100 described in detail above. For example, the assembly 400 includes the memory dies 106 wirebonded to the package substrate by second wirebonds 111b. In the arrangement shown in FIG. 4, a controller die 403 includes bond pads 409 that are wirebonded to third bond pads 408 on the package substrate 102 by third wirebonds 411. In one aspect of this embodiment, a thicker die-attach material (e.g., a film-over-wire material) can attach the support members 130 and the controller die 403 to the stack of memory dies 106. The thicker die-attach material can increase the distance between the stack of memory dies 106 and the package substrate 102 to accommodate a wire portion 412 of each of the third wire bonds 411 beneath the first memory die 106a.

Figure 5:
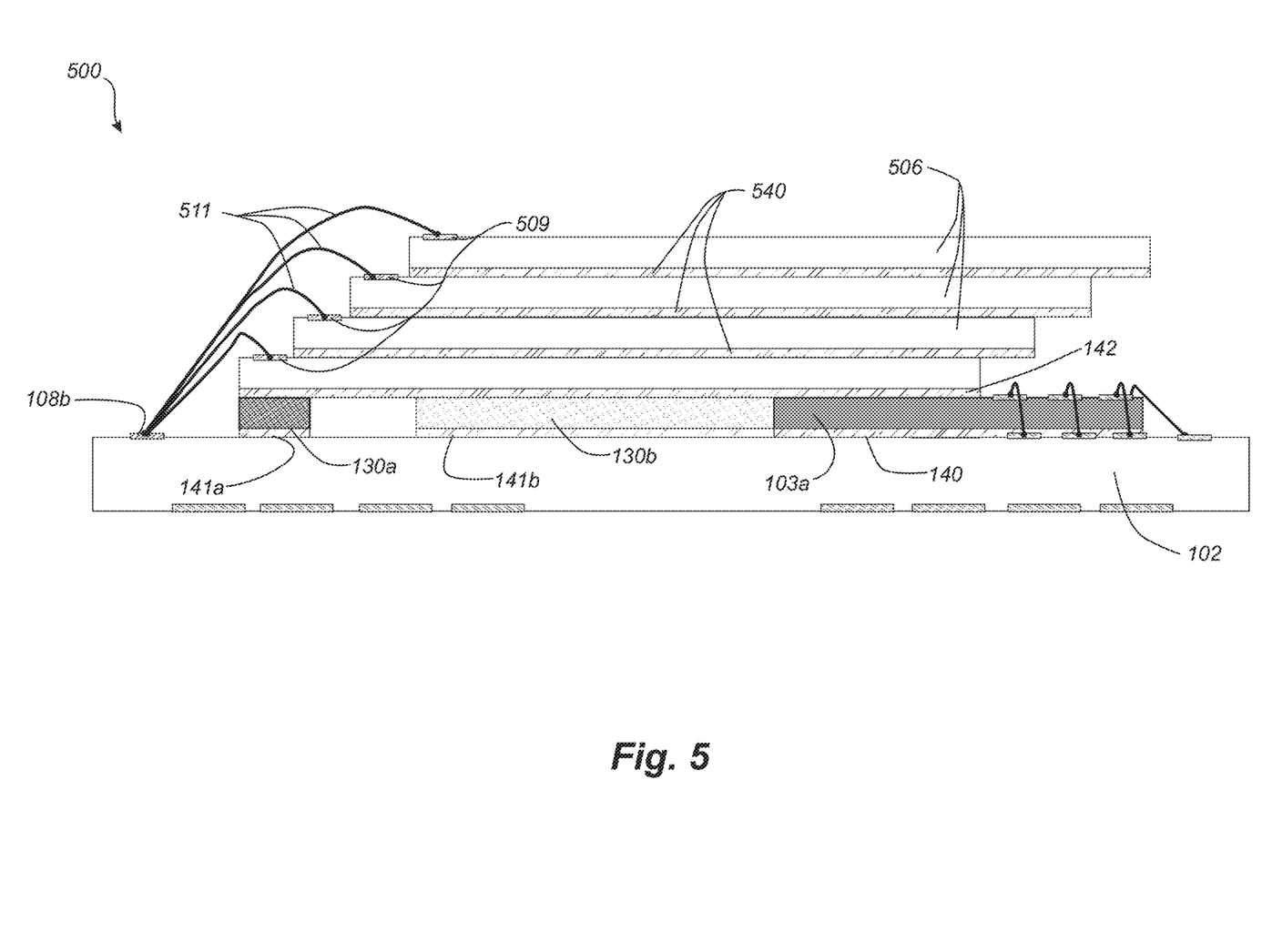
FIG. 5 is a cross-sectional view of a semiconductor die assembly configured in accordance with another embodiment of the present technology.

FIG. 5 is a cross-sectional view of a semiconductor die assembly 500 ("assembly 400") configured in accordance with another embodiment of the present technology. The assembly 500 can include features generally similar to those of the die assemblies described in detail above. For example, the assembly 500 includes the controller die 103 and the support members 130 attached to the package substrate 102 by the die-attach materials 140-c. In the arrangement shown in FIG. 5, individual memory dies 506 are staggered such that individual bond pads 509 of the memory dies 506 are exposed along at least one edge of the stack of memory dies 506. In one aspect of this embodiment, wirebonds 511 can be bonded to the exposed bond pads 509 such that they are not covered by a film-over-wire material (e.g., the over-wire material 143 of FIG. 1A). As such, the memory dies 506 can be assembled using a relatively thinner die-attach material 540 than a film-over-wire material. Also, the stack of memory dies 506 can have a smaller height than a stack of the same number of memory dies attached together with the thicker film-over-wire material.

Figure 6:
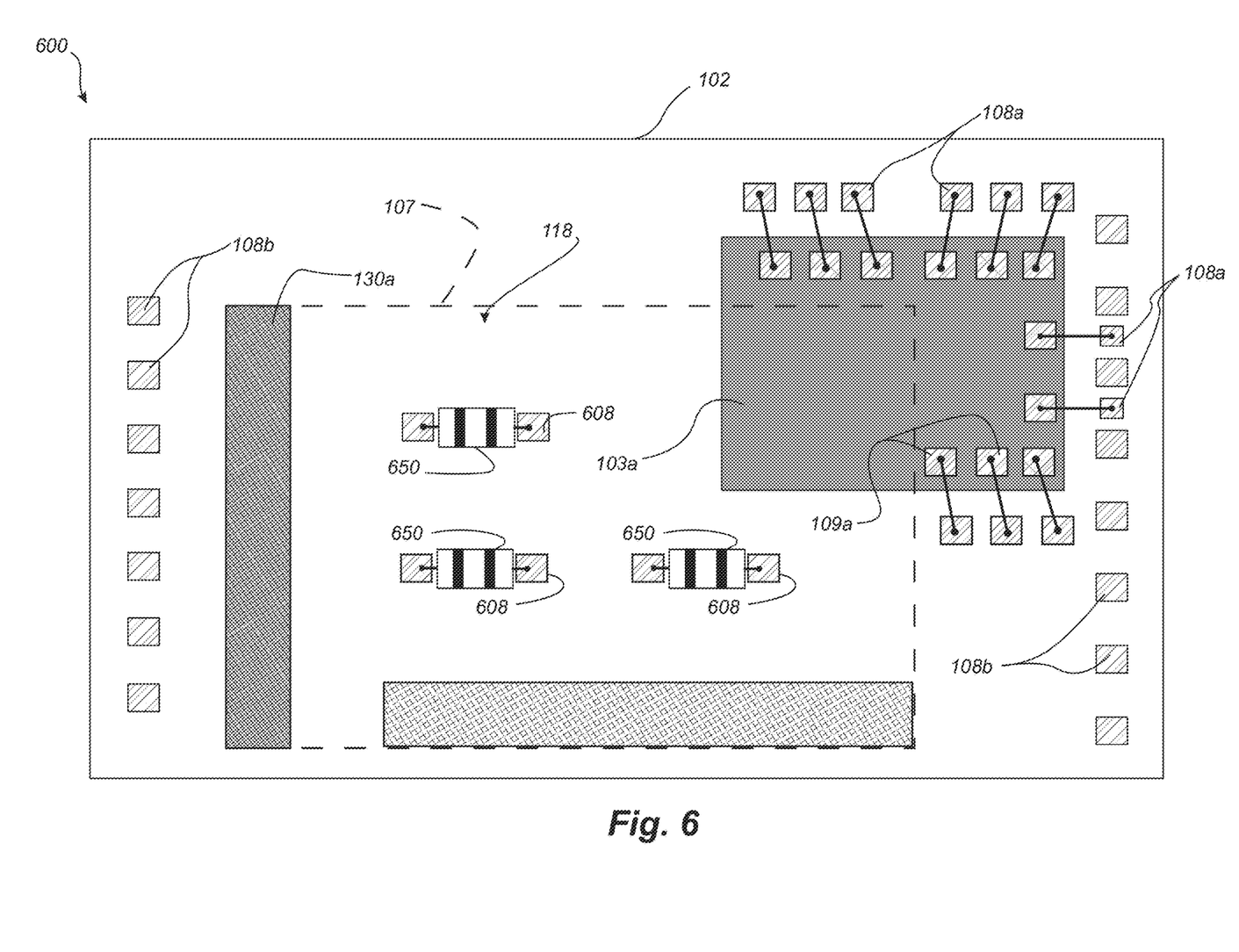
FIG. 6 is a top plan view of a semiconductor die assembly configured in accordance with another embodiment of the present technology.

FIG. 6 is a top plan view of a semiconductor die assembly 600 ("assembly 600") configured in accordance with another embodiment of the present technology. The assembly 600 can include features generally similar to those of the assemblies described in detail above. For example, the assembly 650 includes the controller die 103 positioned partially within the footprint 107 of the memory dies 106 (FIG. 1A). In the illustrated embodiment of FIG. 6 the assembly 600 can also include capacitors 650 within the footprint 107 and coupled to the package substrate 102 via bond pads 608. The capacitors 650 can include, for example, monolithic (e.g., ceramic), integrated circuit, or other suitable capacitor devices. In several embodiments, the capacitors 650 can be configured to condition power signals or facilitate power-up. In other embodiments, the assembly 600 can include additional or alternate circuit elements (e.g., inductors, resistors, and/or diodes) and/or circuit components, such as another semiconductor die at least partially within the footprint 107.

Figure 7A:
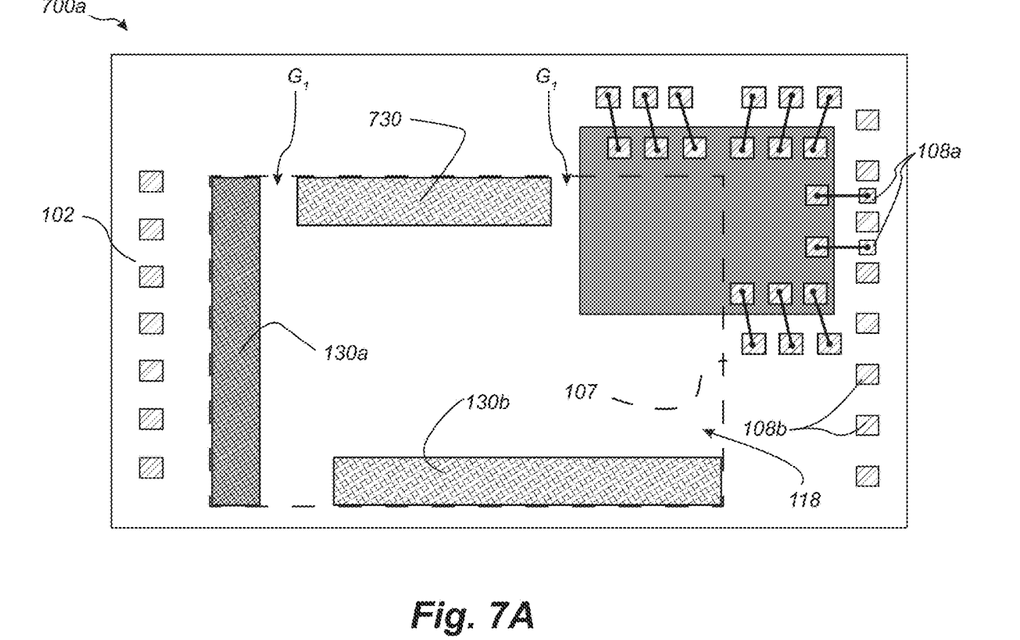
FIGS. 7A and 7B are top plan views illustrating semiconductor die assemblies configured in accordance with several embodiments of the present technology.
Figure 7B:
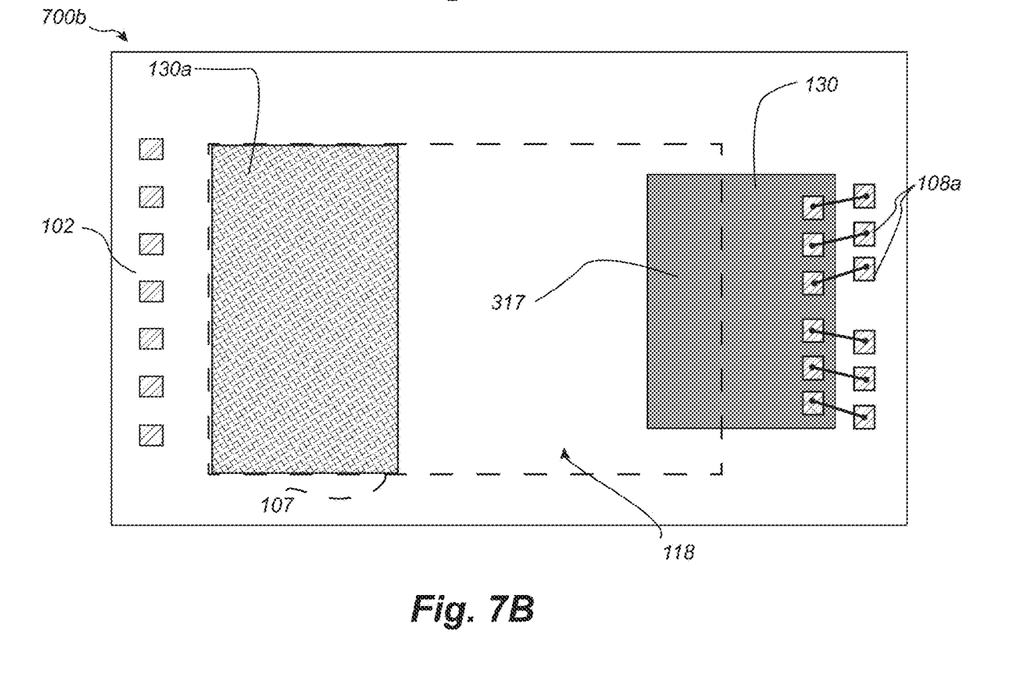

FIGS. 7A and 7B are top plan views illustrating semiconductor die assemblies 700a and 700b, respectively, configured in accordance with several embodiments of the present technology. The assemblies 700a and 700b can each include features generally similar to those of the assemblies described in detail above. For example, the semiconductor die assemblies 700a and 700b can each include the cavity 118 between the package substrate 102 and the memory dies 106 (FIG. 1A) formed by the support members 130.

Referring to FIG. 7A, the semiconductor die assembly 700a includes a third support member 730 (e.g., an elongate member) extending laterally between the first support member 130a and the controller die 103. In several embodiments, the third support member 730 can be spaced apart from the first support member 130a and/or the controller die 103 by gaps G₁ on either side of the third support member 630 of the encapsulant 116 into the cavity 118 to form the casing 115 (FIG. 1A). Referring to FIG. 7B, the semiconductor die assembly 600b can include the first support member 130a but omit the second support member 130b (FIG. 1A). In several embodiments, the controller die 103 can be positioned underneath the stack of memory dies 106 along the entire length of the mounting surface 317 to provide additional mechanical support.

Figure 8:
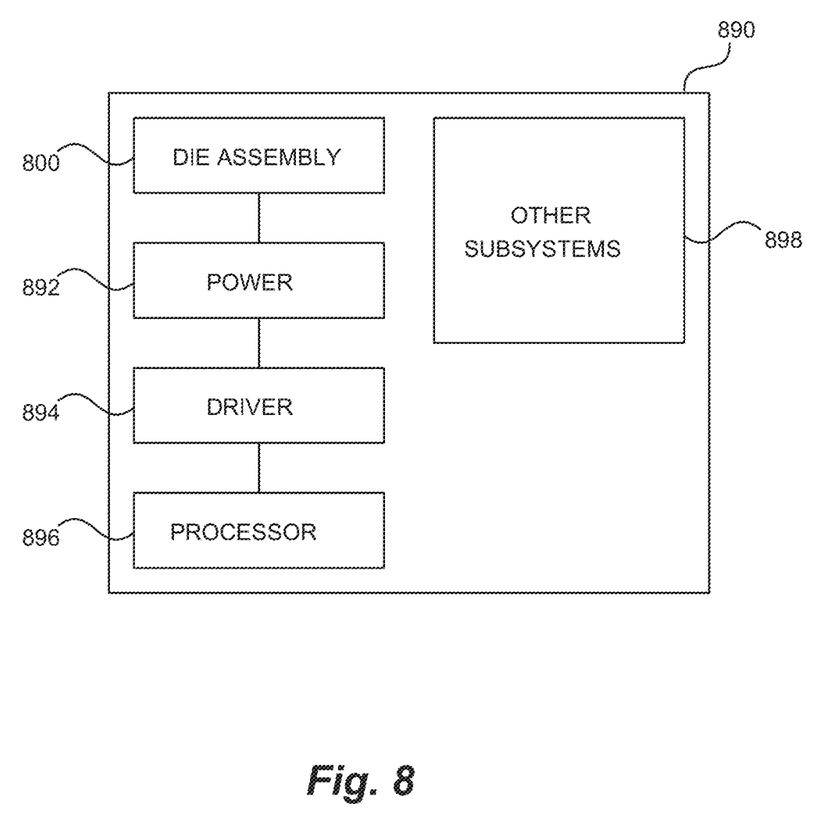
FIG. 8 is a schematic view of a system that includes a semiconductor die assembly configured in accordance with embodiments of the present technology.

Any one of the stacked semiconductor die assemblies described above with reference to FIGS. 1-7B can be incorporated into any of a myriad of larger and/or more complex systems, a representative example of which is system 890 shown schematically in FIG. 8. The system 890 can include a semiconductor die assembly 800, a power source 892, a driver 894, a processor 896, and/or other subsystems or components 898. The semiconductor die assembly 800 can include features generally similar to those of the stacked semiconductor die assemblies described above. The resulting system 890 can perform any of a wide variety of functions, such as memory storage, data processing, and/or other suitable functions. Accordingly, representative systems 890 can include, without limitation, handheld devices (e.g., mobile phones, tablets, digital readers, and digital audio players), computers, and appliances. Components of the system 890 may be housed in a single unit or distributed over multiple, interconnected units (e.g., through a communications network). The components of the system 890 can also include remote devices and any of a wide variety of computer readable media.

From the foregoing, it will be appreciated that specific embodiments of the technology have been described herein for purposes of illustration, but that various modifications may be made without deviating from the disclosure. Also, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor die assembly, comprising:
   a package substrate including a plurality of substrate bond pads;
   a controller die attached to the package substrate, the controller die including a plurality of bond pads proximate to a first edge of the controller die;
   a support member attached to the package substrate, the support member spaced apart from the controller die and opposite the first edge of the controller die;
   a stack of memory dies attached to both the controller die and the support member, wherein:
      the stack of memory dies includes a first memory die attached to the controller die and the support member such that a footprint of the first memory die is partially superimposed over the controller die, wherein an uncovered portion of the controller die includes a first bond pad and a second bond pad of the plurality; and
      the stack of memory dies includes a second memory die attached to the first memory die such that an edge of the second memory die extends past a corresponding edge of the first memory die, the extended portion of the second memory die forming an overhang above the first and second bond pads of the plurality;
   a first wirebond connector connecting the first bond pad of the plurality to a first substrate bond pad of the plurality by extending over the first edge of the controller die; and
   a second wirebond connector connecting the second bond pad of the plurality to a second substrate bond pad of the plurality by extending over a second edge of the controller die that is orthogonal to the first edge.

2. The semiconductor die assembly of claim 1, further comprising:
   a third wirebond connector connecting a bond pad of the first memory die of the stack to a third substrate bond pad of the plurality, wherein the bond pad of the first memory die is located in an exposed portion of the first memory die uncovered by the second memory die.

3. The semiconductor die assembly of claim 2, further comprising:
   a fourth wirebond connector connecting the second substrate bond pad of the plurality to a bond pad of the second memory die of the stack, wherein the bond pad of the second memory die is located in an exposed portion of the second memory die uncovered by a third memory die attached to the second memory die.

4. The semiconductor die assembly of claim 1, wherein the second memory die includes an exposed portion including a bond pad, the exposed portion uncovered by a third memory die of the stack attached to the second memory die, and opposite to the extended portion.

5. The semiconductor die assembly of claim 1, wherein the support member includes a semiconductor memory die.

6. The semiconductor die assembly of claim 1, wherein the support member is a first support member, and the semiconductor die assembly further comprises:
   a second support member attached to the package substrate, the second support member separated from the controller die and the first support member, wherein the footprint of the first memory die of the stack is superimposed over the entire first and second support members.

7. The semiconductor die assembly of claim 6, wherein the first support member or the second support member includes a semiconductor memory die.

8. The semiconductor die assembly of claim 6, wherein:
   at least one edge of the first support member is flush with a first edge of the first memory die of the stack; and
   at least one edge of the second support member is flush with a second edge of the first memory die of the stack, the second edge opposite to the first edge of the first memory die.

9. The semiconductor die assembly of claim 1, further comprising:
   a first die-attach film between the controller die and the substrate package, the first die-attach film including a first thickness; and
   a second die-attach film between the controller die and the first memory die of the stack, the second die-attach film including a second thickness that is the same as the first thickness.

10. A semiconductor die assembly, comprising:
    a package substrate including a plurality of substrate bond pads;
    a first semiconductor die attached to the package substrate, the first semiconductor die including a plurality of bond pads proximate to a first edge of the first semiconductor die;
    a support member attached to the package substrate, the support member spaced apart from the first semiconductor die and opposite the first edge of the first semiconductor die;
    a second semiconductor die attached to both the first semiconductor die and the support member such that a footprint of the second semiconductor die is partially superimposed over the first semiconductor die, wherein an uncovered portion of the first semiconductor die includes a first bond pad and a second bond pad of the plurality;

a third semiconductor die attached to the second semiconductor die such that an edge of the third semiconductor die extends past a corresponding edge of the second semiconductor die, the extended portion of the third semiconductor die forming an overhang above the first and second bond pads of the plurality; and a first wirebond connector connecting the first bond pad of the plurality to a first substrate bond pad of the plurality by extending over the first edge of the first semiconductor die; and a second wirebond connector connecting the second bond pad of the plurality to a second substrate bond pad of the plurality by extending over a second edge of the first semiconductor die that is orthogonal to the first edge.

11. The semiconductor die assembly of claim 10, further comprising:
a third wirebond connector connecting a bond pad of the second semiconductor die to a third substrate bond pad of the plurality, wherein the bond pad of the second semiconductor die is located in an exposed portion of the second semiconductor die uncovered by the third semiconductor die.

12. The semiconductor die assembly of claim 11, further comprising:
a fourth wirebond connector connecting the second substrate bond pad of the plurality to a bond pad of the third semiconductor die, wherein the bond pad of the third semiconductor die is located in an exposed portion of the third semiconductor die uncovered by a fourth semiconductor die attached to the third semiconductor die.

13. The semiconductor die assembly of claim 10, wherein the third semiconductor die includes an exposed portion including a bond pad, the exposed portion uncovered by a fourth semiconductor die attached to the third semiconductor die, and opposite to the extended portion.

14. The semiconductor die assembly of claim 10, wherein the support member includes a semiconductor memory die.

15. The semiconductor die assembly of claim 10, wherein the support member is a first support member, and the semiconductor die assembly further comprises:
a second support member attached to the package substrate, the second support member separated from the first semiconductor die and the first support member, wherein the footprint of the second semiconductor die is superimposed over the entire first and second support members.

16. The semiconductor die assembly of claim 15, wherein the first support member or the second support member includes a semiconductor memory die.

17. The semiconductor die assembly of claim 15, wherein:
at least one edge of the first support member is flush with a first edge of the second semiconductor die; and
at least one edge of the second support member is flush with a second edge of the second semiconductor die, the second edge opposite to the first edge of the second semiconductor die.

18. The semiconductor die assembly of claim 10, further comprising:
a first die-attach film between the first semiconductor die and the substrate package, the first die-attach film including a first thickness; and
a second die-attach film between the first semiconductor die and the second semiconductor die, the second die-attach film including a second thickness that is the same as the first thickness.

19. The semiconductor die assembly of claim 10, wherein:
the first semiconductor die is a controller die; and
the second and third semiconductor dies are semiconductor memory dies.

20. A semiconductor die assembly, comprising:
a package substrate including a plurality of substrate bond pads;
a controller die attached to the package substrate, the controller die including a plurality of bond pads;
a support member attached to the package substrate, the support member spaced apart from the controller die;
a first memory die attached to both the controller die and the support member such that a footprint of the first memory die is partially superimposed over the controller die, wherein an uncovered portion of the controller die includes at least two bond pads of the plurality of bond pads;
a second memory die attached to the first memory die such that an edge of the second memory die extends past a corresponding edge of the first memory die, the extended portion of the second memory die forming an overhang above the at least two bond pads of the plurality; and
a plurality of wirebond connectors connecting the at least two bond pads of plurality to at least two substrate bond pads of the plurality of substrate bond pads, different ones of the plurality of wirebond connectors extending over different edges of the controller die.

* * * * *